US011562776B2

(12) United States Patent
Nguyen

(10) Patent No.: US 11,562,776 B2
(45) Date of Patent: Jan. 24, 2023

(54) PERFORMING READ OPERATIONS ON GROUPED MEMORY CELLS

(71) Applicant: Micron Technology, Inc., Boise, ID (US)

(72) Inventor: Dung V. Nguyen, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/342,171

(22) Filed: Jun. 8, 2021

(65) Prior Publication Data
US 2022/0392500 A1 Dec. 8, 2022

(51) Int. Cl.
*G11C 7/00* (2006.01)
*G11C 7/10* (2006.01)
*H03K 19/20* (2006.01)
*H03K 23/00* (2006.01)

(52) U.S. Cl.
CPC .......... *G11C 7/1069* (2013.01); *G11C 7/1096* (2013.01); *H03K 19/20* (2013.01); *H03K 23/005* (2013.01)

(58) Field of Classification Search
CPC ..................................................... H03K 19/20
USPC ............................................... 365/189.011
See application file for complete search history.

(56) References Cited

U.S. PATENT DOCUMENTS

2009/0141537 A1* 6/2009 Arsovski .............. G11C 7/1006
365/189.15
2020/0105340 A1* 4/2020 Yabe .................... G11C 11/5628

\* cited by examiner

*Primary Examiner* — Hoai V Ho
(74) *Attorney, Agent, or Firm* — Schwegman Lundberg & Woessner, P.A.

(57) ABSTRACT

A request to perform a read operation on a memory device is received. The memory device includes a first group of memory cells. The first group of memory cells represents a first sequence of bits based on a first sequence of charge levels formed by the first group of memory cells. The read operation is performed by obtaining a first read signal for a first memory cell and a second read signal for a second memory cell of the first group of memory cells. A first rule logic is applied to the first read signal to generate a first updated signal and a second rule logic is applied to the second read signal to generate a second updated signal. Logic functions are applied to the first and second updated signals to generate an output signal indicating the first sequence of bits stored by the first group of memory cells.

20 Claims, 10 Drawing Sheets

| Super-cell Level | X cell | Y Cell | Bit 0 | Bit 1 | Bit 2 |
|---|---|---|---|---|---|
| 0 | 0 | 0 | 0 | 0 | 0 |
| 1 | 0 | 1 | 0 | 0 | 1 |
| 2 | 0 | 2 | 0 | 1 | 0 |
| 3 | 1 | 0 | 1 | 1 | 1 |
| 4 | 1 | 1 | 1 | 0 | 0 |
| 5 | 1 | 2 | 1 | 1 | 1 |
| 6 | 2 | 0 | - | - | 0 |
| 7 | 2 | 1 | - | - | 1 |
| 8 | 2 | 2 | - | - | - |

PERFORMING READ OPERATIONS ON GROUPED MEMORY CELLS

TECHNICAL FIELD

Embodiments of the disclosure relate generally to memory sub-systems, and more specifically, relate to performing data operations on grouped memory cells.

BACKGROUND

A memory sub-system can be a storage device, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 is a block diagram illustrating an example matrix mapping charge levels of a group of memory cells to bit representations, in accordance with some embodiments of the present disclosure.

DETAILED DESCRIPTION

Figure 1:
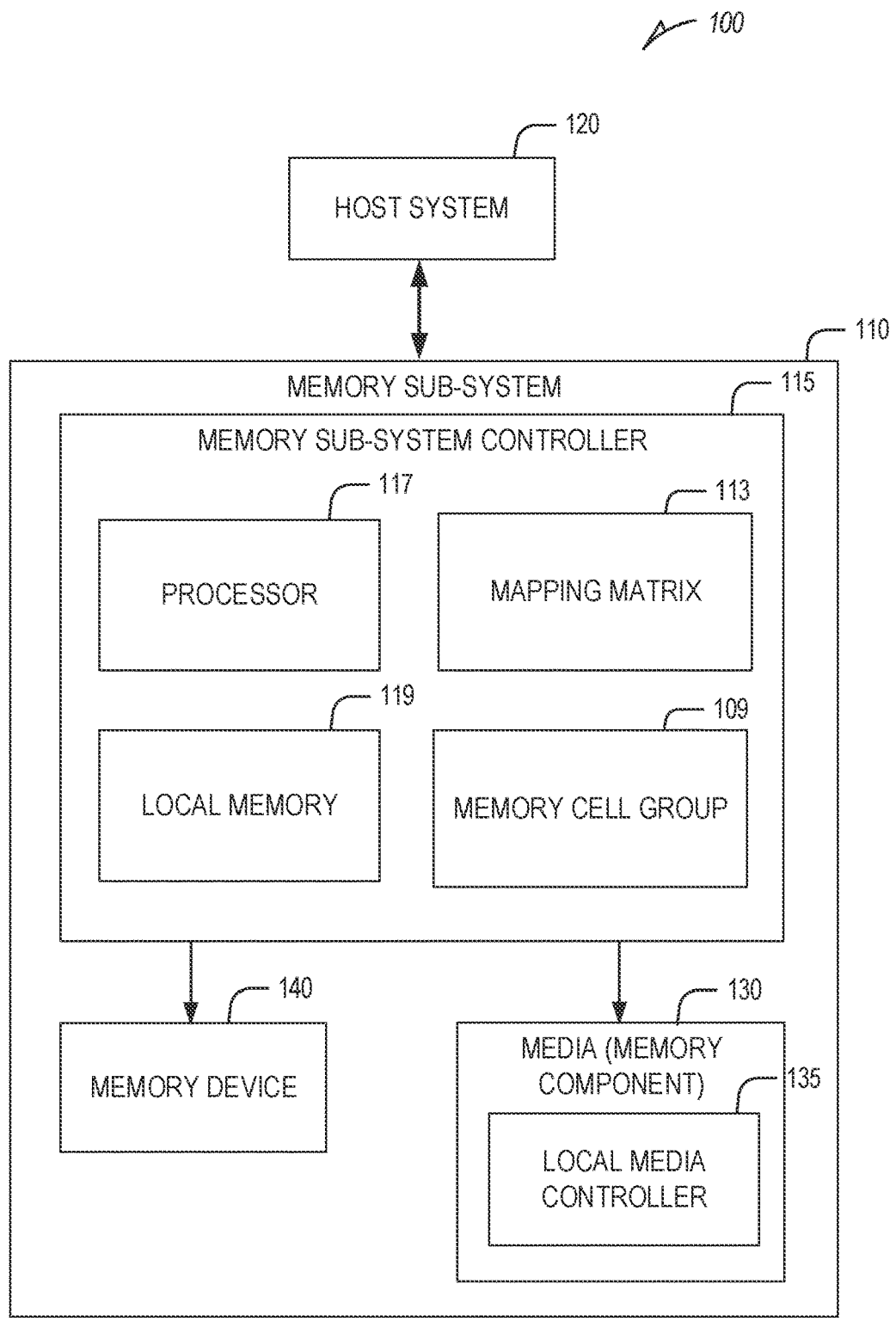
FIG. 1 is a block diagram illustrating an example computing environment that includes a memory sub-system in accordance with some embodiments of the present disclosure.

Aspects of the present disclosure are directed to performing data operations on grouped memory cells, which can be part of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components (also hereinafter referred to as "memory devices"). The host system can provide data to be stored at the memory sub-system and can request data to be retrieved from the memory sub-system.

A memory device can be a non-volatile memory device. One example of a non-volatile memory device is a negative-and (NAND) memory device. Other examples of non-volatile memory devices are described below in conjunction with FIG. 1. Some memory devices, such as NAND memory devices, include an array of memory cells (e.g., flash cells) to store data. Each cell includes a transistor, and within each cell, data is stored as the threshold voltage of the transistor, based on the logical value of the cell (e.g., 0 or 1). Memory cells in these devices can be grouped as pages that can refer to a logical unit of the memory device used to store data. For example, memory cells in NAND memory devices are connected horizontally at their control gates to a word line to form a page. With some types of memory devices (e.g., NAND), pages are grouped to form blocks (also referred to herein as "memory blocks").

The host system can send access requests (e.g., write command, read command) to the memory sub-system, such as to store data on a memory device at the memory sub-system, read data from the memory device on the memory sub-system, or read/write constructs with respect to a memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can include error handling data (e.g., error-correcting code (ECC) codeword, parity code), data version (e.g., used to distinguish age of data written), valid bitmap (which LBAs or logical transfer units contain valid data), and so forth.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system.

The memory sub-system can initiate media management operations, such as a write operation, on host data that is stored on a memory device. For example, firmware of the memory sub-system can re-write previously written host data from a location of a memory device to a new location as part of garbage collection management operations. The data that is re-written, for example, as initiated by firmware, is hereinafter referred to as "garbage collection data."

"User data" hereinafter generally refers to host data and garbage collection data. "System data" hereinafter refers to data that is created and/or maintained by the memory sub-system for performing operations in response to host request and for media management. Examples of system data include, and are not limited to, system tables (e.g., logical-to-physical (L2P) memory address mapping table (also referred to herein as a L2P table)), data from logging, scratch pad data, and so forth.

A memory device can be a non-volatile memory device. A non-volatile memory device is a package of one or more die. Each die can be comprised of one or more planes. For some types of non-volatile memory devices (e.g., negative-and (NAND)-type devices), each plane is comprised of a set of physical blocks. For some memory devices, blocks are the smallest areas that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are a raw memory device combined with a local embedded controller for memory management within the same device package.

A traditional computer system, such as a conventional supercomputer, can perform operations on memory units storing integer numbers of bits of data. Memory cells (e.g., flash memory cells) store data by applying a specified voltage or charge level to the memory cell. The stored charge level is indicative of a bit representation of the memory cell. A single-layer cell can store two charge levels indicating either a 0 or a 1. The single-layer cell can thus store one bit of data. As memory cells become more complex to store more bits of data, the number of charge levels increases by a power of 2. Physical limitations of memory cells make it difficult to reliably increase the number of charge levels to store greater numbers of bits. For example, a multi-level cell (MLC) has four charge levels and can store two bits of data. A triple-level cell (TLC) has eight charge levels and can store three bits of data. A quarto-level cell (QLC) has sixteen charge levels and can store four bits of data. The greater the number of charge levels per cell and the greater number of bit representations, the cell density increases. However, physical limitations of a memory cell make it difficult to differentiate between the charge levels and the memory cells wear out faster. Due to the increase of data density, electrical charge leakage can occur and cause data corruption. For a memory cell such as a penta-level cell (PLC), it is incredibly difficult to differentiate between thirty-two charge levels. Although it is desired to have a singular memory cell storing four, five, or more bits of data, conventional memory cells do not have the reliability needed for such cells to be useful.

Parts of the present disclosure address the above and other issues by performing various data operations on a grouped memory cell. In particular, various embodiments enable the memory device to store an integer number of bits of data without sacrificing reliability based on a high number of charge levels per individual memory cell.

Traditional methods allow data to be read from memory by applying read reference voltages to a control gate of each memory cell to sense the cell's threshold voltage. In a SLC, reading the value stored in the cell is simple and the sensed voltage need only be distinguished between a bit value of 0 from the state representing a bit value of 1. To read different bits of a multi-level cell (MLC), the bit states must be distinguished by determining whether the threshold voltage of the cell is between two voltage levels, requiring two read reference voltages to be applied to determine the bit value. Similarly, reading a TLC requires one read reference voltage to read a least significant bit (LSB), two read reference voltages to read the center significant bit (CSB), and four read reference voltages to read the most significant bit (MSB).

By use of various embodiments, performing data operations on grouped memory cells can be performed on a memory device or a memory sub-system. Accordingly, some embodiments can provide the ability to store higher volumes of data without needing to add physical memory cells. With respect to transactional memory, a data operation mechanism can be used to enable a memory device or a memory sub-system to virtually group two or more memory cells together to create a grouped cell with the ability to store an integer number of bits of data. The integer number of bits of data is higher than the capacity of each individual memory cell prior to grouping. In this way, a memory device of various embodiments can store more data without sacrificing reliability. A corresponding method for performing data operations on grouped memory cells allow a streamlined process for performing data operations such as read operations across multiple memory cells.

Benefits include the ability to leverage the stable memory cell charge level capacities to create a group that can store a higher integer number of bits than each of the individual memory cells alone.

Though various embodiments are described herein with respect to a memory sub-system controller, some embodiments implement features described herein (e.g., operations for reading data, writing data) as part of a memory device (e.g., a controller, processor, or state machine of a memory die). For instance, various embodiments implement read operations as part of a controller, processor, or state machine for each bank within a memory device.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 140), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein. "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110. The host system 120 can be a computing device such as a desktop computer, laptop computer, network server, mobile device, or such computing device that includes a memory and a processing device.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface. Fiber Channel. Serial Attached SCSI (SAS). Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Low Power Double Data Rate (LPDDR), or any other suitable interface. The physical host interface can be used to transmit data between the host system 120 and the memory sub-system 110. The host system 120 can further utilize an NVM Express (NVMe) interface to access the memory components (e.g., memory device 140) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory device 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random-access memory (SDRAM).

Some examples of non-volatile memory devices (e.g., memory device 140) includes a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device 140 can include one or more arrays of memory cells such as single level cells (SLCs) or multi-level cells (MLCs) (e.g., triple level cells (TLCs), quad-level cells (QLCs), and penta-level cells (PLCs), can store multiple bits per cell. In some embodiments, each of the memory devices 140 can include one or more arrays of memory cells such as SLCs. MLCs, TLCs, QLCs, or any combination of such. In some embodiments, a particular memory component can include an SLC portion, and an MLC portion, a TLC portion, or a QLC portion of memory cells. The memory cells of the memory devices 140 can be grouped as pages or memory blocks that can refer to a unit of the memory component used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 140 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM). Spin Transfer Torque (STT)-MRAM, conductive bridging RAM (CBRAM), resistive random access memory (RRAM), oxide-based RRAM (OxRAM), negative-or (NOR) flash memory, and electrically erasable programmable read-only memory (EEPROM).

The memory sub-system controller 115 can communicate with the memory devices 140 and/or memory component 130 to perform operations such as reading data, writing data, or erasing data at the memory devices 140 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or another suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and so forth. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory component 130 and/or the memory device 140. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 140. The memory sub-system controller 115 can further include host interface circuitry to communicate with the host system 120 via the physical host interface. The host interface circuitry can convert the commands received from the host system into command instructions to access the memory devices 140 as well as convert responses associated with the memory devices 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 140.

In some embodiments, the memory devices 140 include local media controllers 135 that operate in conjunction with memory sub-system controller 115 to execute operations on one or more memory cells of the memory devices 140. An external controller (e.g., memory sub-system controller 115) can externally manage the memory device 140 (e.g., perform media management operations on the memory device 140). In some embodiments, a memory device 140 is a managed memory device, which is a raw memory device combined with a local controller (e.g., local media controller 135) for media management within the same memory device package. An example of a managed memory device is a managed NAND (MNAND) device.

The memory sub-system controller 115 includes mapping matrix component 113 that can provide and/or generate mapping information of charge levels to bit representations for grouped memory cells on a memory device (e.g., memory device 140). The mapping matrix component 113 can enable the memory sub-system 110 (via the memory sub-system controller 115) to perform operations such as read and write memory operations based on grouped memory cells. The memory-sub system 110 can maintain matrices storing assignments of charge levels to bit representations for numerous groups of memory cells. By using the groups of memory cells and the matrix representation of a mapping of charge levels to bit representations, more data can be stored with the same number of memory cells in comparison to conventional methodologies of using memory cells. Additionally, each memory cell can effectively store (via a charge level of the memory cell), a non-integer number of bits (e.g., X.5 number of bits).

The mapping matrix component 113 can store some or all mapping information for grouped memory cells of an individual memory device. The mapping matrix component 113 can additionally store various data including logic functions mapped for reading pages of grouped memory cells. Additionally, the memory cell group and mapping matrix can store more data in the given physical memory cells than conventional systems having the same number of physical memory cells. Further details with regards to the operations of the mapping matrix component 113 and the memory cell group component 109 are described below. An example of this is illustrated and described herein with respect to FIG. 2.

Figure 2:
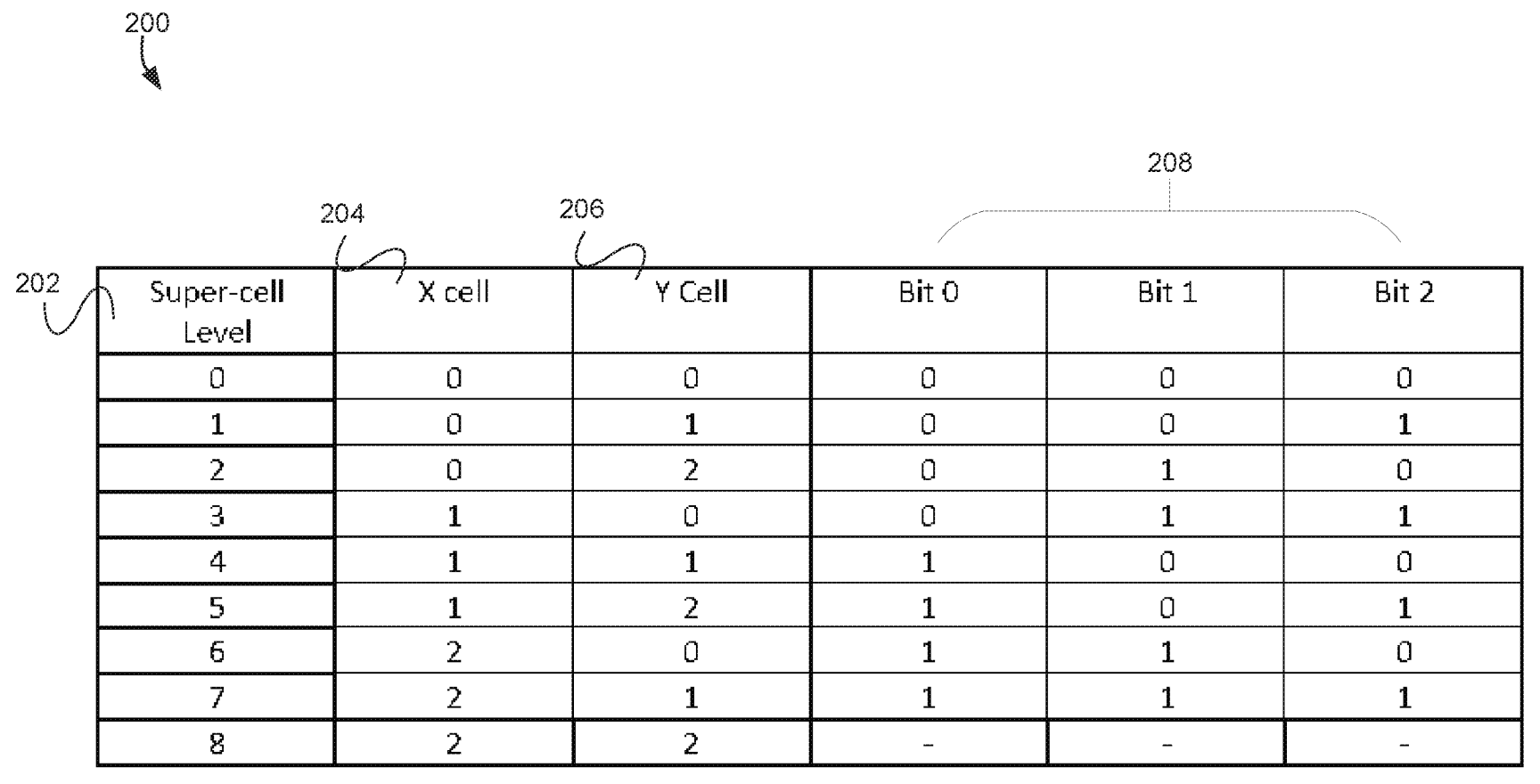

FIG. 2 illustrates an example mapping matrix 200 of a first group of cells. As shown, FIG. 2 shows a matrix mapping 200 of a first cell 204 (e.g., X-cell) and a second cell 206 (e.g., Y-cell) in a group of memory cells 202, which can also be referred to herein as a "supercell". In the example, each of the first cell 204 and the second cell 206 supports three charge levels (0, 1, 2). The three charge levels can be used to represent three bits (e.g., columns bit 0, bit 1, and bit 2; 208). The charge levels for the first cell 204 and the second cell 206 are combined into a "supercell." capable of nine distinct charge levels (0 through 8), allowing the "super-cell" to represent three bits.

The last row of the mapping matrix 200 is shown in a gray shade. This row can be deemed a "don't care" charge level as the number of charge levels of the group of memory cells 202 exceeds the number of charge levels needed to represent three bits. In some embodiments, charge level 8 of the group of cells 202 is deemed the "don't care" level. In some embodiments, any of the charge levels of the group of cells can be deemed to be the "don't care" level. The number of "don't care" levels can correspond to the number of bits represented and the number of charge levels in the group of cells.

The mapping assigns an individual sequence of charge levels, stored by an individual group of memory cells, to an individual sequence of bits represented by the individual group of memory cells. In some embodiments, the mapping assigns the individual sequence of charge levels to the individual sequence of bits that satisfies a specified Gray code constraint, or below a specified Gray code penalty. As used herein, Gray code can comprise a particular mapping of bits to symbols (e.g., charge levels) that minimize the Hamming distance (number of bit difference) between two adjacent symbols (e.g., charge levels). The Gray code constraint is a number of bit flip per symbol error with an error rate (e.g., Gray code constraint) of 1.

Figure 3A:
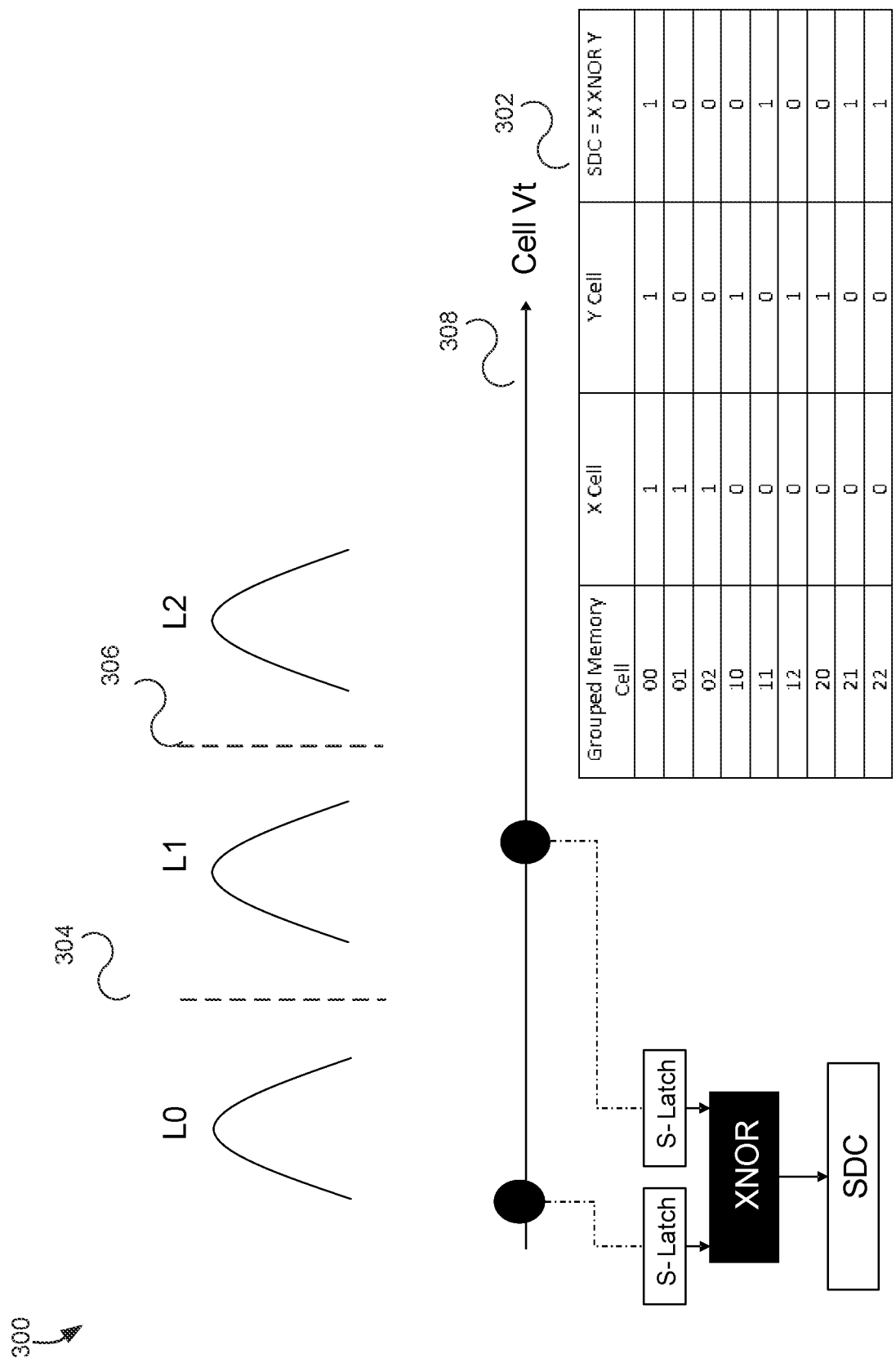
FIGS. 3A-3C illustrate an example read operation performed on a group of memory cells in accordance with embodiments of the present disclosure.

FIG. 3A-3D illustrates an example read operation performed on a group of memory cells. As shown in FIG. 3A, a first matrix read level diagram 300 is shown for a cell with three charge levels (e.g., L0, L1, L2). The first matrix read level diagram can be obtained by retrieving a mapping of the grouped cell from memory. The matrix read level diagram can include one or more Boolean logic operations to be applied to obtain a read level between the cells of the group.

To read a specific page of a group of cells (e.g., page 0), a read level 304 is applied at a voltage between two charge levels (e.g., L0 and L1). In some embodiments, page 2 is referred to herein as the least significant bit (LSB). The read level 304 is applied at the same location (e.g., voltage level) for each of the cells of the group. For example, if a group comprises two cells (cells X and Y), the read level is applied to each of the two cells at the same voltage level. To read page 0 of the group of cells, a read level is placed between L0 and L1 to read a voltage level of each cell. The X cell can conduct while the Y cell does not (or vice versa). In some embodiments, if the bit line for the page conducts, the sensing result is assigned a high value (or 1). Assigning the value based whether the read level is conducting or not conducting is specific to the rule assigned to the location or valley 306 where the read level is applied. As used herein, a valley (e.g., 306) can refer to the voltage level between two charge levels of a cell. A logical operation assigned to reading the value of page 0 of the group of cells is applied to the read voltage levels of each cell (e.g., read voltage levels of cell X and cell Y). The logical operation is predetermined and assigned for read operations on each page of the group of cells. In some embodiments, the logical operations are mapped to each page and stored in a mapping matrix (e.g., mapping matrix 200). As shown on the cell Vt line (e.g., cell voltage line 308), a cell at a voltage higher than the read level 304 and another cell is at a voltage lower than the read level 304. Specific to page 0, the rule at valley 306 is the conducting cell at the read level 304 is assigned a high value (e.g., 1). It is understood that the assignment of a high or low value can be predetermined and specified for each valley for each page of a group of cells.

As shown in FIG. 3A, an XNOR operation is applied to the signals from cell X and cell Y. A logical table 302 may include the various bit values that are represented by the combination of the cells in the group of cells. Based on the values obtained from the logical XNOR operation, a bit value is obtained by using the table 302. For example, if the X cell is at level 0 and the Y cell is at level 1 (row 3), the X cell will conduct as shown (e.g., 1 means conducting in the X cell column), and the Y cell will not conduct as shown (e.g., 0 means not conducting). The XNOR of X and Y becomes 1*XNOR 0=0. As such, 0 will be stored in the SDC latch that connects to the X cell and the Y cell. In some embodiments, logical table 302 may be stored along with the mapping matrix (e.g., matrix mapping 200, FIG. 2) corresponding to the group of cells.

The resulting signal (0 or 1) is stored in a secondary data cache (SDC). SDCs are buffers that hold the resulting signal data, temporarily as needed.

Figure 3B:
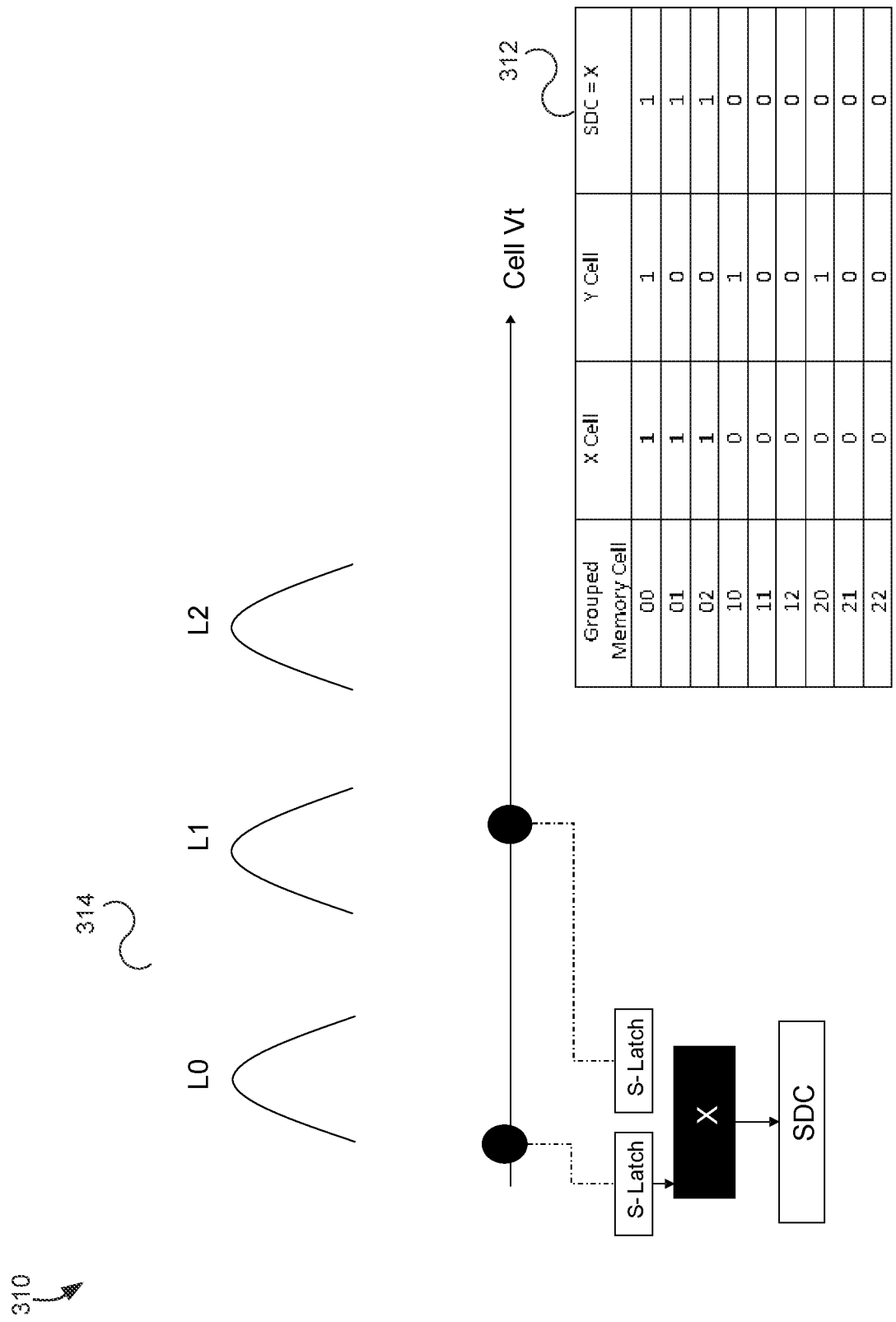

FIG. 3B illustrates another example scenario 310 for a first step in a read operation performed on a group of memory cells to read a value of page 2 of the group of cells. In some embodiments, page 2 is referred to herein as the most significant bit (MSB). In FIG. 3B, a read level 314 is placed on the cell gate at a voltage level between L0 and L1. Similar to how page 0 is read in the example shown in FIG. 3A, the cells of the group of cells are read using read level 314. A second logical operation is applied to the resulting signal received from the cells. As shown in FIG. 3B, the value of the X cell is used to determine the bit value of page 1. Logical table 312 provides the mapping of values of the grouped memory cell and the table. Since the logic implements the table, the logical table does not necessarily need to be stored. The logical table is shown in the figures as a visual indicator and does not necessarily need to be stored within the memory. However, the logical table may in some embodiments, be stored along with the matrix mapping (e.g., mapping matrix 200, FIG. 2) corresponding to the group of cells.

Figure 3C:
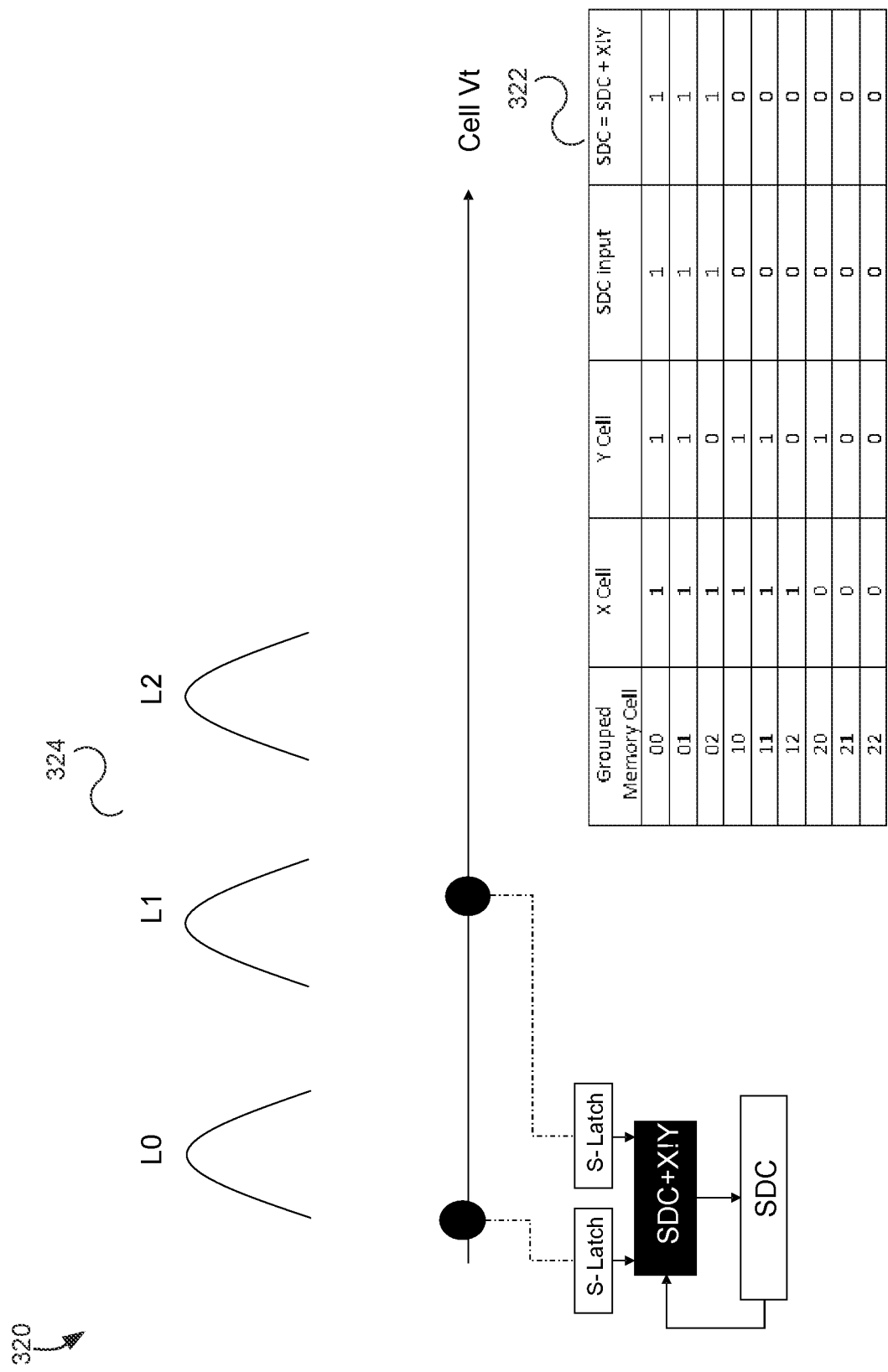

FIG. 3C illustrates a second step in a read operation corresponding to example scenario 310 shown in FIG. 3B. The example scenario 320 for a read operation performed on a group of memory cells to read a portion of page 2 of the group of cells. In some embodiments, page 2 is referred to herein as the most significant bit (MSB). A read level 324 is placed between L1 and L2. The number of read levels needed to determine the bit representation of page 2 is determined by the Gray code mapping of the group of cells. For instance, in a 1-2-4 Gray code mapping of a group, one read level is used to find the value of a first page (or least significant bit), two read levels are used to find the value of a second page (or center significant bit), and four read levels are used to find the value of a third page (or most significant bit). As shown in FIG. 3B, the logical operation is simply taking the binary value of the signal of cell X and disregarding the value of the signal of cell Y. The logical table 312 provides the mapping of values of the grouped memory cell and the table can be stored along with the matrix mapping (e.g., mapping matrix 200, FIG. 2) corresponding to the group of cells for reading the value of page 1.

As shown in FIG. 3B-3C, two read commands are used to read page 2. Sensing is performed at both valleys between L0 and L1 in example scenario 310 as well as between L1 and L2 as shown in example scenario 320.

In FIG. 3C, a read level 324 is placed on the cell gate at a voltage level between L1 and L2. Similar to how page 0 and are read in the example shown in FIG. 3A-3B, the cells of the group of cells are read using read level 324. A third logical operation is applied to the resulting signal received from the cells. As shown in FIG. 3C, the logical operation is the cached value stored in the secondary data cache (SDC) added to the logical operation of X!Y.

Figure 4:
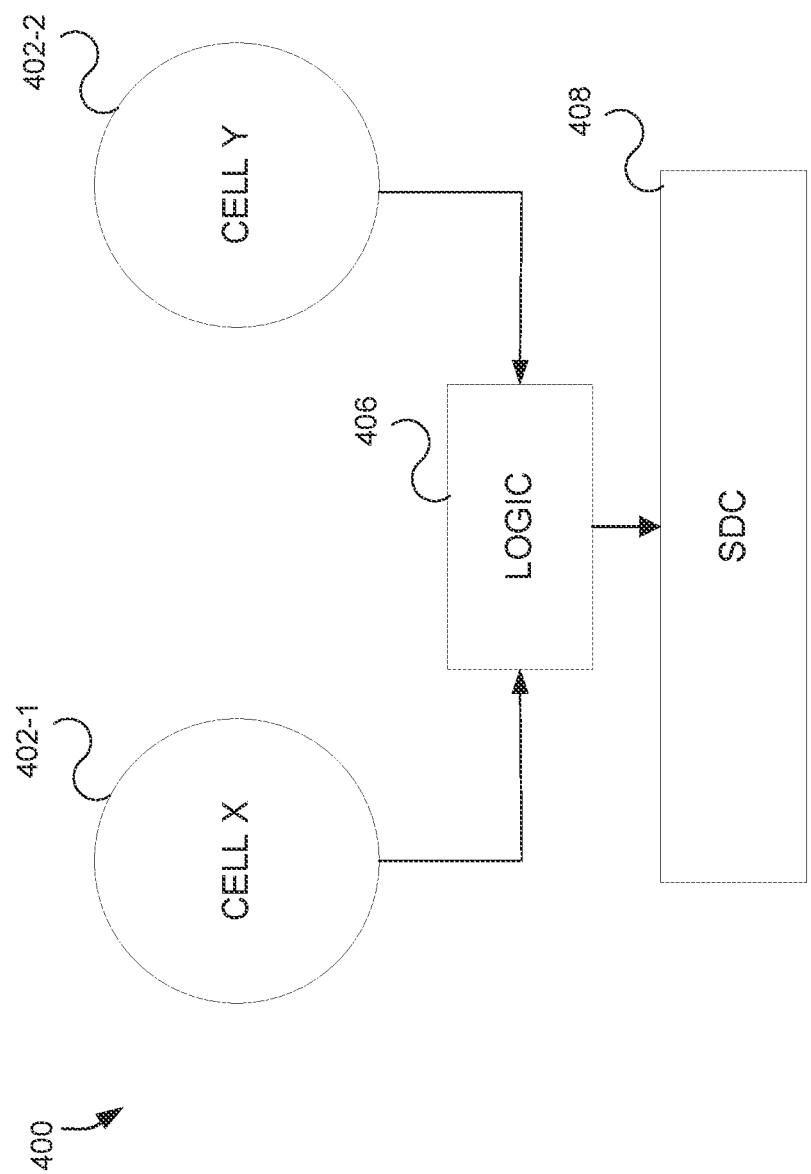
FIG. 4 is a block diagram illustrating a process of obtaining a signal for the read operation on a group of memory cells in accordance with embodiments of the present disclosure.

FIG. 4 is a block diagram describing the process of obtaining a signal from each of cells X 402-1 and Y 402-2 of a group of cells for performing a read operation on the group of cells. The signal from cell X and the signal from cell Y are used as inputs to a logical operation 406 that has been predetermined prior to the read operation for the specific page. The resulting signal of the logical operation is loaded into the secondary data cache (SDC) 408 and may be sent back to the requesting entity.

Figure 5A:
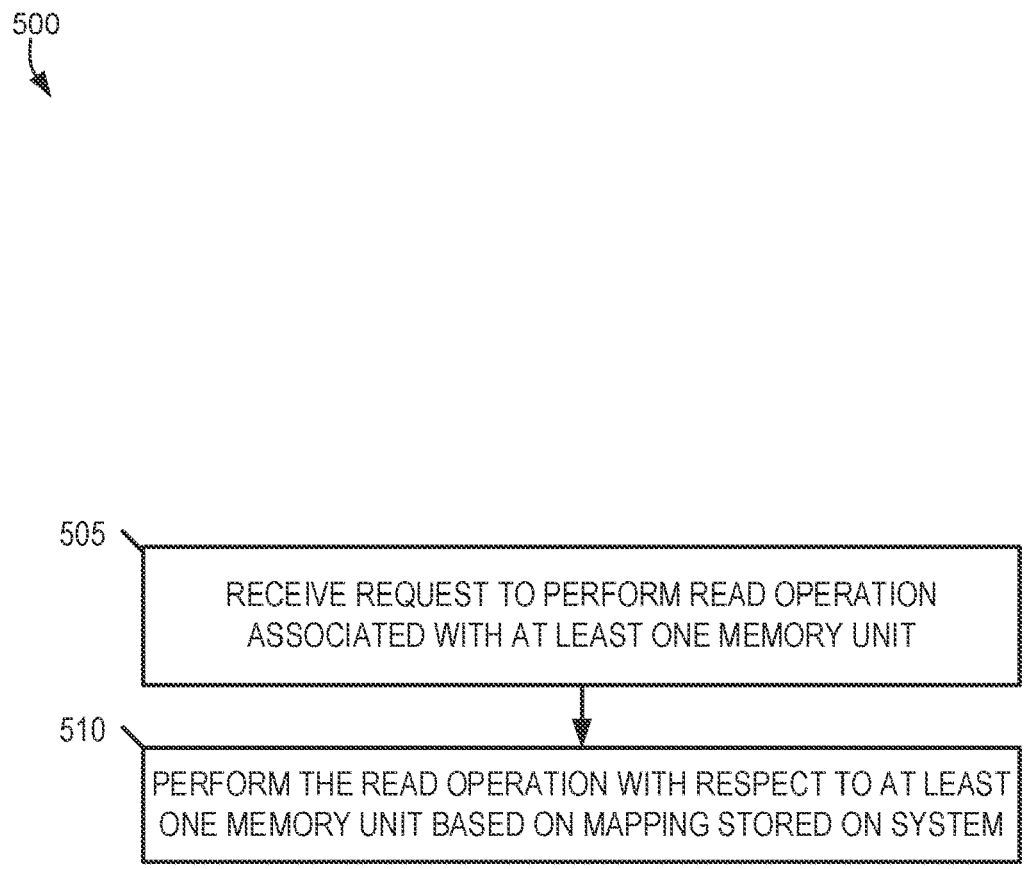
FIGS. 5A-5B illustrate a flow diagram of an example method for performing read operations on grouped memory cells, in accordance with embodiments of the present disclosure.
Figure 5B:
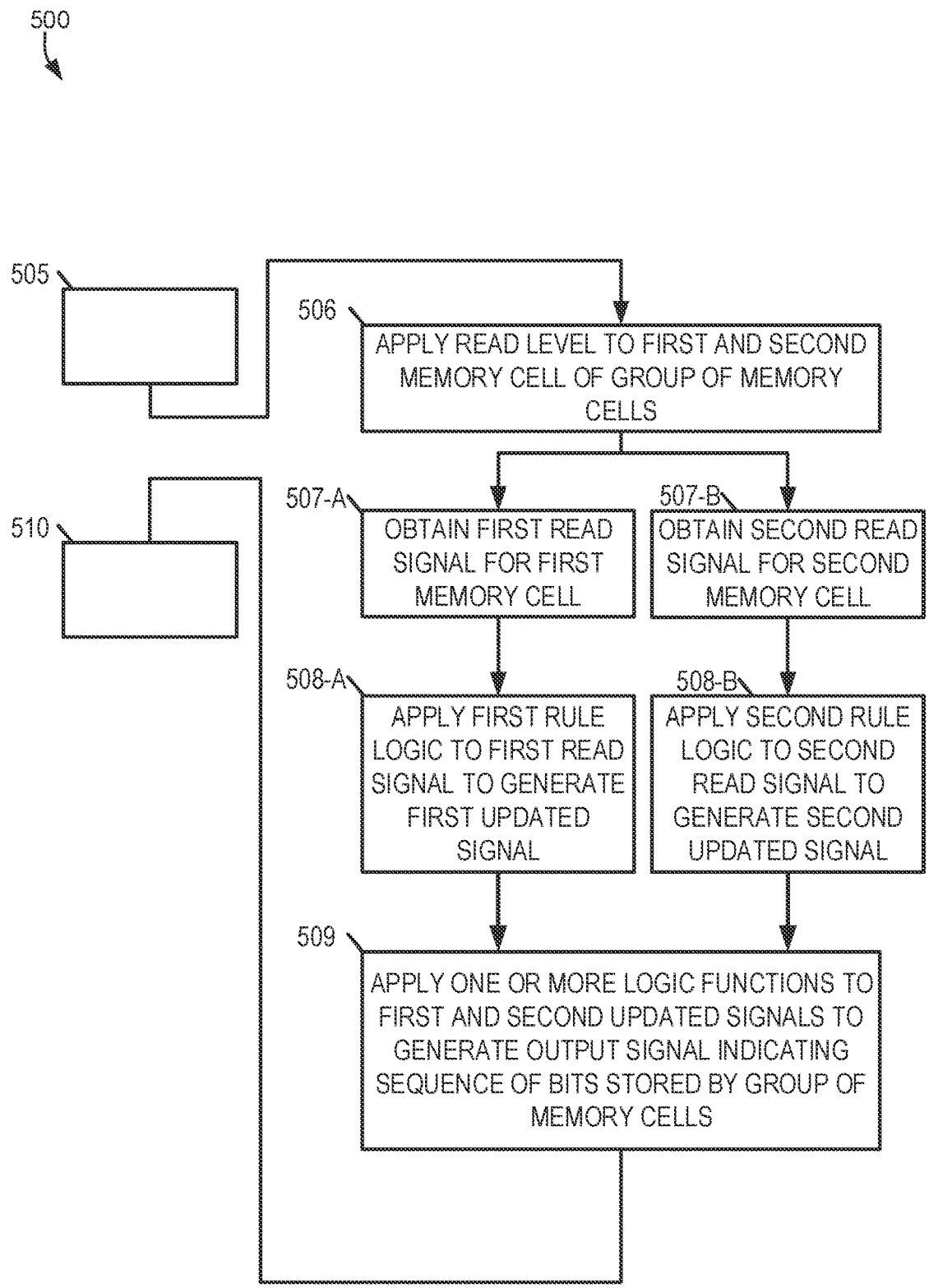

FIG. 5A-5B illustrate a flow diagram of an example method 500 to perform data operations on a group of memory cells in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the mapping matrix component 113 of FIG. 1 alone or in combination with memory cell group component 109 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are made use of in every embodiment. Other process flows are possible.

Referring now to FIG. 5A, at operation 505, the processing device receives a request to perform a data operation associated with at least one memory unit. The memory device can include a plurality of memory units, each memory unit including a first group of memory cells. Each memory cell in the first group of memory cells supports a specified number of charge levels such that each charge level represents a non-integer number of bits. The first group of memory cells represents a first sequence of bits based on a first sequence of charge levels stored by the first group of memory cells, and the first sequence of bits has an integer number of bits.

In some embodiments, the first group of memory cells includes two or more memory cells. Each memory cell supports the same number of charge levels. For example, a first and a second memory cell can each support 23 charge levels, which can enable the first and the second memory cells to each represent non-integer number of bits (e.g., 4.5 bits per each of the first and second memory cells).

For example, a first group of memory cells can comprise a first and a second memory cell, where each of the first and the second memory cell supports 23 charge levels, and as a result, the first group of memory cells supports 529 different sequences of charge levels. The sequence of bits comprises 9 bits of data. The memory device can include 16 KB word lines of data, and each word line is represented by 9 pages of 8 KB of data.

In some embodiments, each of the first and the second memory cells supports 24 charge levels and the first group of memory cells supports 579 different sequences of charge levels. Other suitable configurations are available and contemplated as part of this disclosure.

In some embodiments, the first group of memory cells includes a first and a second memory cell, each of the first and second memory cells supports 3 charge levels and supports the individual sequence of 1.5 bits of data. In some other embodiments, each of the first and second memory cells supports 6 charge levels and represents 2.5 bits of data. In some other embodiments, each of the first and second memory cells supports 12 charge levels and represents 3.5 bits of data. In some other embodiments, each of the first and second memory cells supports 23 or 24 charge levels and represents 4.5 bits of data.

Referring now to operation 506-A of FIG. 5B, the processing device applies a read level to a first and a second memory cell of the group of memory cells. In some embodiments, the processing device uses a Gray code mapping of the first group of memory cells to determine a number of read levels to apply to each of the first and second memory cells of the first group of memory cells.

At operation 507-A, the processing device obtains a first read signal for the first memory cell. In parallel, the processing device obtains a second read signal for the second memory cell at operation 507-B. The parallel processing can include the first and second read signals being applied to obtain a first and second signal and the process is performed at substantially the same time and/or simultaneously for the first and second cell.

The processing device at operation 508-A applies a first rule logic to the first read signal to generate a first updated signal. In parallel, the processing device applies a second rule logic to the second read signal to generate a second updated signal at operation 508-B. In some embodiments, the first rule logic and the second rule logic are the same.

One or more logic functions are applied to the first and second updated signals to generate an output signal indicating a sequence of bits stored by the group of memory cells at operation 509. In some embodiments, the output signal is a single bit. In some embodiments, the one or more logic functions includes distinct logic functions for obtaining each bit of the integer number of bits represented by the first group of memory cells.

For example, the logic function is XNOR. AND, OR, XOR, X, Y, X!Y (X AND not Y), or XY! (X AND Y not). It is appreciated that any Boolean logic function with a number of inputs corresponding to a number of cells of a group of cells can be used as the logic function. The logic function is however specified in the mapping of the group of cells and specific to each page of the group of cells. The first and second rule logics are discussed with greater detail with regard to the rules at the valleys and logical operations as described in FIGS. 3A-3C. In some embodiments, the output signal is used to update a data cache (e.g., SDC) in accordance with a determination that the first read signal for the first memory cell indicates the first memory cell is conductive. In some embodiments, the output signal is used to update a data cache in accordance with a determination that the second read signal for the second memory cell indicates that the second memory cell is conductive.

Referring again to FIG. 5A at operation 510, the processing device performs the read operation with respect to at least one memory unit based on the mapping stored on the system. The operations of 505 through 510 can be repeated for some embodiments.

Figure 6:
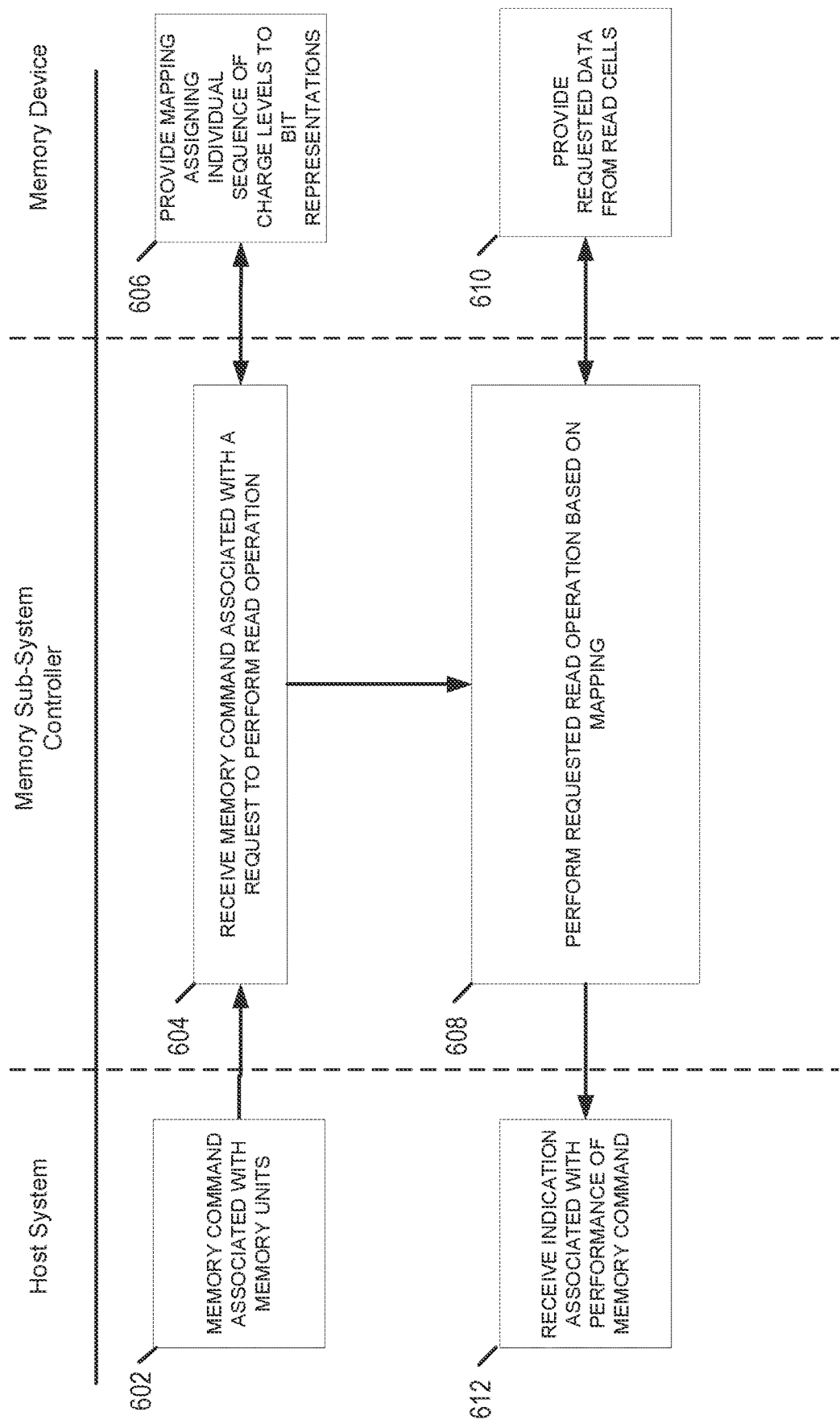
FIG. 6 illustrates an interaction diagram providing interactions between components of a computing environment in the context of some embodiments in which a method for performing read operations on grouped memory cells as described herein is performed.

FIG. 6 provides an interaction diagram illustrating interactions between components of a computing environment in the context of some embodiments in which a method that uses allocation techniques of data on a memory device as described herein is performed. The operations of the method can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method is performed by a host system (e.g., host system 120), a memory sub-system controller (e.g., memory sub-system controller 115), a memory device (e.g., memory device 140), or some combination thereof. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, and/or alternatively, one or more processes can be omitted in various embodiments. Thus, not all processes are used in every embodiment. In the context of the example illustrated in FIG. 6, the host system can include the host system 120, the memory sub-system controller can include the memory sub-system controller 115, and the memory device can include the memory device 140.

As shown in FIG. 6, at operation 602, the host system sends a memory command to the memory sub-system 110 in association with a memory unit. In some embodiments, the memory command is a read command. At operation 604, the memory sub-system controller 115 receives the memory command associated with a request to perform a read operation on a group of cells. The memory device, at operation 606, provides a mapping assigning individual sequences of charge levels to individual sequences of bit representations for memory units of the memory device 140.

In response to the memory command received at operation 608, the memory sub-system controller 115 performs the requested data operation. The data operation is performed based on the mapping assignment of the memory device 140. Based on the mapping, the sequence of charge levels corresponding to the first sequence of charge levels is determined. A read operation is performed, including applying one or more read levels to each memory cell of the group of cells. By utilizing the Gray code mapping of the charge levels to the group of cells, the requested read operation is performed on the group of cells. After the read levels are applied to the memory cell, corresponding read signals are retrieved for each cell and a first rule logic is applied to generate an updated signal. The updated signals for each cell are used as inputs to a predetermined Boolean logic function to determine the stored bit value corresponding to the read operation on the group of cells.

In accordance with a received read memory command, at operation 610, the memory device 140 provides the requested data from the read cells of the group of memory cells associated with the memory command.

At operation 612, after the performance of the requested data operation is completed by the memory sub-system controller 115, the host system 120 receives an indication associated with performance of the memory command. The host system can repeat the steps of 602-612 by providing one or more additional memory commands associated with memory units to the memory sub-system controller 115.

Figure 7:
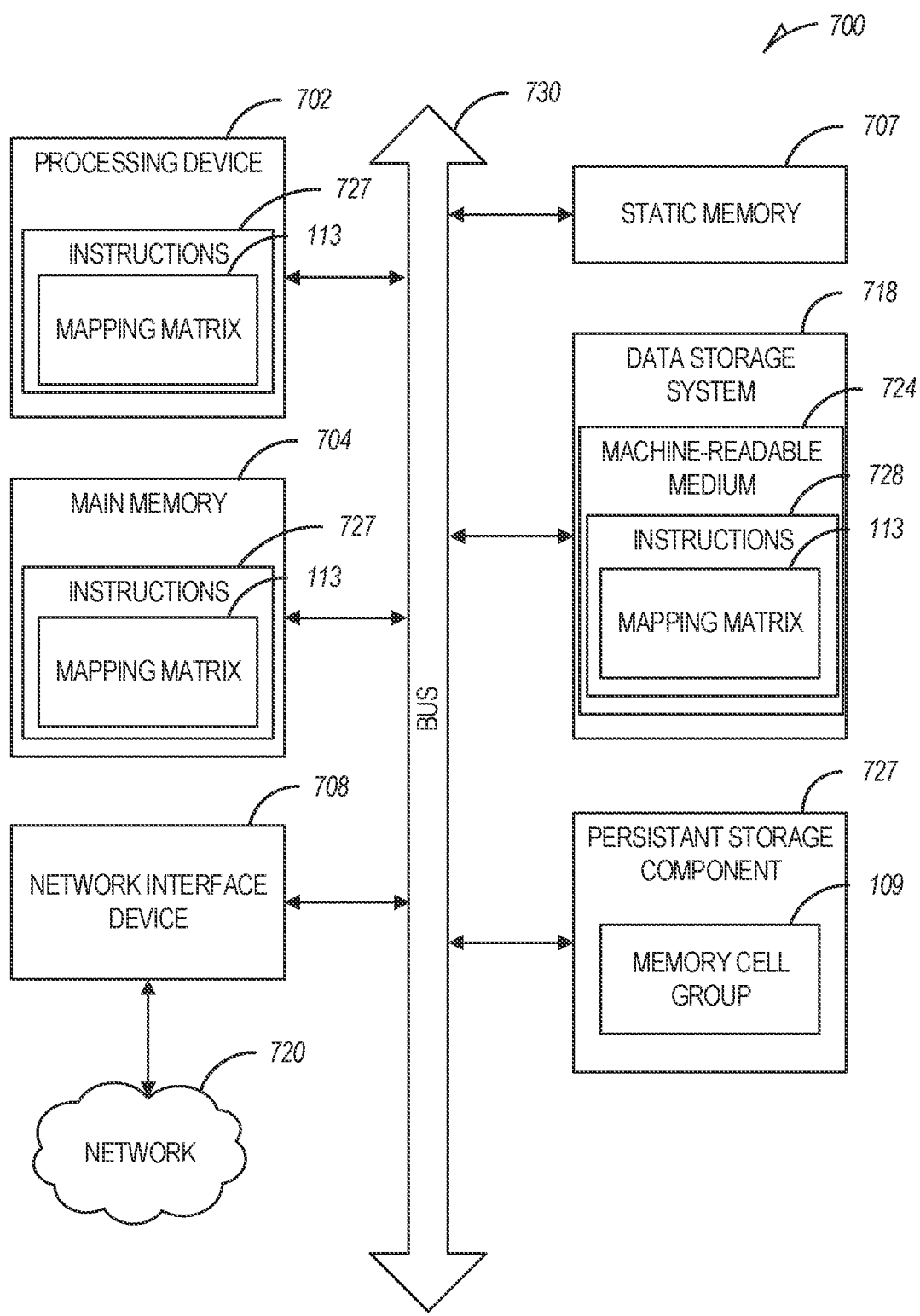
FIG. 7 illustrates a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the mapping matrix component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 728 or software embodying any one or more of the methodologies or functions described herein. The instructions 728 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a memory cell group component (e.g., the memory cell group component 109 and/or mapping matrix component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs. EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader parts of embodiments of the disclosure as set forth in the following claims. The specification and drawings are, accordingly, to be regarded in an illustrative sense rather than a restrictive sense.

What is claimed is:

1. A system comprising:
a plurality of memory components including one or more memory cells of a memory device; and
a processing device, operatively coupled with the plurality of memory components, to:
receive a request to perform a read operation associated with at least one memory component in the plurality of memory components, the at least one memory component comprising a first group of memory cells, the first group of memory cells comprising a first and a second memory cell, the first memory cell storing a first charge level that represents a first plurality of bits, the second memory cell storing a second charge level that represents a second plurality of bits, the first and the second pluralities of bits each comprising a non-integer number of bits; and
perform the read operation on the at least one memory component by:
applying a read level to each of a first and a second memory cell of the first group of memory cells to obtain a first read signal for the first memory cell and obtain a second read signal for the second memory cell;
based on the first read signal, apply a first rule logic to the first read signal to generate a first updated signal;
based on the second read signal, apply a second rule logic to the second read signal to generate a second updated signal; and
applying one or more logic functions to the first and the second updated signals to generate an output signal indicating a sequence of bits stored by the first group of memory cells.

2. The system of claim 1, wherein an individual charge level stored in each memory cell in the first group of memory cells represents a non-integer number of bits, charge levels stored in the first group of memory cells in combination representing an integer number of bits.

3. The system of claim 2, wherein the one or more logic functions comprises distinct logic functions for obtaining each bit of the integer number of bits represented by charge levels stored in the first group of memory cells.

4. The system of claim 1, wherein the performing of the read operation comprising:
using a Gray code mapping of the first group of memory cells to determine a number of read levels to apply to each of the first and the second memory cells of the first group of memory cells.

5. The system of claim 1, wherein at least one logic function of the one or more logic functions is configured to disregard the second read signal of the second memory cell.

6. The system of claim 1, wherein the output signal is used to update a data cache in accordance with a determination that the first read signal for the first memory cell indicates the first memory cell is conductive.

7. The system of claim 6, wherein the output signal is used to update a data cache in accordance with a determination that the second read signal for the second memory cell indicates the second memory cell is conductive.

8. The system of claim 1, wherein the read level is applied to each of the first and the second memory cell of the first group of memory cells simultaneously.

9. At least one non-transitory computer readable storage medium comprising instructions that, when executed by a processing device, cause the processing device to perform operations comprising:
receiving a request to perform a read operation associated with at least one memory unit in a plurality of memory units of a memory device, the at least one memory unit comprising a first group of memory cells, the first group of memory cells comprising a first and a second memory cell, the first memory cell storing a first charge level that represents a first plurality of bits, the second memory cell storing a second charge level that represents a second plurality of bits, the first and the second pluralities of bits each comprising a non-integer number of bits; and
performing the read operation on the at least one memory unit, the performing of the read operation comprising:
applying a read level to each of a first and a second memory cell of the first group of memory cells to obtain a first read signal for the first memory cell and obtain a second read signal for the second memory cell;
based on the first read signal, applying a first rule logic to the first read signal to generate a first updated signal;
based on the second read signal, applying a second rule logic to the second read signal to generate a second updated signal;
applying one or more logic functions to the first and the second updated signals to generate an output signal indicating a sequence of bits stored by the first group of memory cells; and
storing the output signal in a data cache.

10. The storage medium of claim 9, wherein the performing of the read operation comprising:
using a Gray code mapping of the first group of memory cells to determine a number of read levels to apply to each of the first and the second memory cells of the first group of memory cells.

11. The storage medium of claim 9, wherein the one or more logic functions comprises distinct logic functions for obtaining each bit of an integer number of bits represented by charge levels stored in the first group of memory cells.

12. The storage medium of claim 9, wherein at least one logic function of the one or more logic functions is configured to disregard the second read signal of the second memory cell.

13. The storage medium of claim 9, wherein a logic function of the one or more logic functions is an XNOR operation.

14. The storage medium of claim 9, wherein the output signal is used to update the data cache in accordance with a determination that the first read signal for the first memory cell indicates the first memory cell is conductive.

15. The storage medium of claim 9, wherein the output signal is used to update the data cache in accordance with a determination that the second read signal for the second memory cell indicates the second memory cell is conductive.

16. The storage medium of claim 9, wherein the read level is applied to each of the first and the second memory cells of the first group of memory cells simultaneously.

17. A method performed at a memory device comprising a plurality of memory units, each memory unit comprising one or more memory cells, the method comprising:

receiving, at a memory controller of the memory device, a request to perform a read operation associated with at least one memory unit in the plurality of memory units, the at least one memory unit comprising a first group of memory cells, the first group of memory cells comprising a first and a second memory cell, the first memory cell storing a first charge level that represents a first plurality of bits, the second memory cell storing a second charge level that represents a second plurality of bits, the first and the second pluralities of bits each comprising a non-integer number of bits; and performing the read operation on the at least one memory unit, the performing of the read operation comprising:

applying a read level to each of a first and a second memory cell of the first group of memory cells to obtain a first read signal for the first memory cell and obtain a second read signal for the second memory cell;

based on the first read signal, applying a first rule logic to the first read signal to generate a first updated signal;

based on the second read signal, applying a second rule logic to the second read signal to generate a second updated signal;

applying one or more logic functions to the first and the second updated signals to generate an output signal indicating a sequence of bits stored by the first group of memory cells; and updating a data cache to include the output signal.

18. The method of claim 17, wherein an individual charge level stored in each memory cell in the first group of memory cells represents a non-integer number of bits, charge levels stored in the first group of memory cells in combination representing an integer number of bits.

19. The method of claim 18, wherein the one or more logic functions comprises distinct logic functions for obtaining each bit of the integer number of bits represented by charge levels stored in the first group of memory cells.

20. The method of claim 17, wherein performing of the read operation comprises:

using a Gray code mapping of the first group of memory cells to determine a number of read levels to apply to each of the first and the second memory cells of the first group of memory cells.

* * * * *